United States Patent [19]

Yamaha et al.

[11] Patent Number: 5,997,754
[45] Date of Patent: Dec. 7, 1999

[54] METHOD OF FABRICATING MULTI-LAYERED WIRING

[75] Inventors: Takahisa Yamaha; Masaru Naito, both of Hamamatsu, Japan

[73] Assignee: Yamaha Corporation, Japan

[21] Appl. No.: 08/994,884

[22] Filed: Dec. 19, 1997

[30] Foreign Application Priority Data

Dec. 30, 1996 [JP] Japan ................................ 8-358862
Jul. 22, 1997 [JP] Japan ................................ 9-211326

[51] Int. Cl.$^6$ .................................................. H01B 13/00
[52] U.S. Cl. .............................. 216/17; 216/18; 438/720
[58] Field of Search ........................ 216/17, 18; 438/720

[56] References Cited

U.S. PATENT DOCUMENTS

| | | | |
|---|---|---|---|
| 4,756,977 | 7/1988 | Haluska et al. | 428/704 |
| 5,059,448 | 10/1991 | Chandra et al. | 427/53.1 |
| 5,085,893 | 2/1992 | Weiss et al. | 427/387 |
| 5,118,530 | 6/1992 | Hanneman et al. | 427/226 |
| 5,145,723 | 9/1992 | Ballance et al. | 427/397.7 |
| 5,336,532 | 8/1994 | Haluska et al. | 427/515 |
| 5,370,904 | 12/1994 | Mine et al. | 427/126.2 |
| 5,380,567 | 1/1995 | Haluska | 427/578 |
| 5,399,441 | 3/1995 | Bearinger et al. | 428/689 |
| 5,458,912 | 10/1995 | Camilletti et al. | 427/126.4 |
| 5,506,177 | 4/1996 | Kishimoto et al. | 437/195 |

FOREIGN PATENT DOCUMENTS

| | | |
|---|---|---|
| 6-181203 | 6/1994 | Japan . |
| 6-181204 | 6/1994 | Japan . |
| 7-240460 | 9/1995 | Japan . |

OTHER PUBLICATIONS

B.T. Ahlburn, et al., "A Non–Etch Back Spin on Glass for 0.5μM Devices Using Hydrogen Silsesquioxane as A Replacement for Methylsiloxane", Jun. 7–8, 1994, VMIC Conference, 1994 ISMIC, pp. 120–122.

B.T. Ahlburn, et al., "Hydrogen Silsesquioxane–Based Flowable Oxide as an Element in the Interlevel Dielectric for Sub 0.5 Micron ULSI Circuits", Feb. 21–22, 1995, VMIC Conference, 1995 ISMIC, pp. 36–42.

D. Pramanik, et al., "Reliability of Multilevel Circuits Using Hydrogen Silsesquioxane FO for Interlevel Dielectric Planarization", Jun. 8–9, 1993, VMIC Conference, 1993 ISMIC, pp. 329–331.

Brochure of Flowable Oxide by Dow Corning Corporation (1993), pp. 1–4.

R. Dawson, et al., "Performance of Logic Devices Utilizing A Novel Spin–On Dielectric Planarization Process", Jun. 8–9, 1993, VMIC Conference, 1993 ISMIC, p. 218.

D.S. Ballance, et al., "Low Temperature Reflow Planarization Using A Novel Spin–On Interlevel Dielectric", Jun. 9–10, 1992, VMIC Conference, 1992 ISMIC, pp. 180–186.

*Primary Examiner*—Timothy Speer
*Attorney, Agent, or Firm*—Ostrolenk, Faber, Gerb & Soffen, LLP

[57] ABSTRACT

A wiring layer 36A is formed by sputtering, reflowing and patterning of an Al alloy layer on insulating layers 32 and 34 covering the surface of a semiconductor substrate 30. A silicon oxide layer 38 is formed by coating a hydrogen silsesquioxane resin film flatly over the layer 36A and by successive heat treatment. Then a silicon oxide layer 40 is formed on the layer 38 by plasma-enhanced chemical vapor deposition. After formation of the desired connecting hole in an interlayer insulating layer made of a lamination of the layers 38 and 40, a wiring layer 46 connected with the layer 36A via the connecting hole is formed by sputtering, reflowing and patterning of an Al alloy layer. Results of the measurements of the resistance of the via chains having 20000 vias indicated that resistace rise has not been observed. A multi-layered wiring which is highly resistant to stress migration is provided.

6 Claims, 5 Drawing Sheets

METHOD OF FABRICATING MULTI-LAYERED WIRING

This application is based on Japanese patent applications, No.8-358862 and No.9-211326, the entire contents of which are incorporated herein by reference.

BACKGROUND OF THE INVENTION

1. Field of the Invention

The present invention relates to a method of fabricating a multi-layered wiring suitable for manufacturing LSI or other devices, and more particularly to a method of fabricating multi-layered wiring which is highly resistant to stress migration.

2. Description of the Related Art

Such a conventional method of fabricating multi-layered wiring is known in that an interlayer insulating layer is made by a lamination of the first silicon oxide layer formed by plasma-enhanced chemical vapor deposition (PECVD), the second silicon oxide layer is formed on the first silicon oxide layer using hydrogen silsesquioxane resin and the third silicon oxide layer is formed on the second silicon oxide layer by PECVD (for example, refer to JP-A 7-240460).

According to an investigation by the present inventors, it was found that there is a problem that the resistance to stress migration is low if a multi-layered wiring structure is fabricated by the use of an interlayer insulating layer made by a lamination of the first to third silicon oxide films as mentioned above.

FIG. 10 shows a multi-layered wiring structure having such an interlayer insulating layer, the structure of which can be obtained as follows: a borophosphosilicate glass (BPSG) film 14 is formed by CVD on a silicon oxide layer 12 covering a surface of the semiconductor substrate 10 made of silicon. Thereafter, wiring layers 16A and 16B are formed on the BPSG film 14 by sputtering, reflowing and patterning an aluminium (Al) alloy layer.

On the BPSG film 14, a conformal silicon oxide layer 18 is formed by PECVD, covering the wiring layers 16A and 16B. On the silicon oxide layer 18, a planarized silicon oxide layer 20 is formed by spin coating of a solution of hydrogen silsesquioxane resin and by subsequent heat treatment. On the silicon oxide layer 20, a silicon oxide layer 22 is formed by PECVD. The silicon oxide layer 22 has a flat surface because it is formed on a flattened surface.

A connecting hole 24 is formed through the interlayer insulating layer made by a lamination of the silicon oxide layers 18, 20 and 22 by partly an isotropic wet etching using, resist layer as a mask to have a reduced step height and partly an anisotropic dry etching. On the silicon oxide layer 22, a wiring layer 26 is formed to be electrically connected to the wiring layer 16 via the connecting hole 24, by sputtering, reflowing and patterning an Al alloy layer.

After an annealing in hydrogen atmosphere for reducing process damages, a passivation film 28 made of silicon nitride is formed covering the wiring layer 26 on the silicon oxide layer 22 by PECVD.

As the result of a stress migration test in which the above-mentioned multi-layered wiring structure is heated at 200° C. for 2000 hours, it was found that a void V is generated, resulting in an increase of the wiring resistance or a break-down.

SUMMARY OF THE INVENTION

It is an object of the present invention to provide a novel multi-layered wiring method capable of forming a multi-layered wiring which is highly resistant to stress migration.

According to one aspect of the present invention, there is provided a method of fabricating a wiring comprising the steps of: a) providing a substrate; b) forming a first wiring layer on the substrate; c)forming a hydrogen silsesquioxane resin film over the first wiring layer to fill spaces created by the first wiring layer and to be directly held in contact with the first wiring layer; d) subjecting said hydrogen silsesquioxane resin film to a heat treatment so as to provide a first interlayer insulating layer; e) forming a second interlayer insulating layer on the first interlayer insulating layer; f) forming a hole through the first and second interlayer insulating layers down to the first wiring layer; and g) forming a second wiring layer over the substrate to be electrically connected to the first wiring layer.

The first interlayer insulating layer is formed by using hydrogen silsesquioxane resin and the second interlayer insulating layer is formed thereon to collectively form an interlayer insulating layer. It is possible to realize a multi-layered wiring which is highly resistant to stress migration.

DESCRIPTION OF THE PREFERRED EMBODIMENTS

Figure 1:
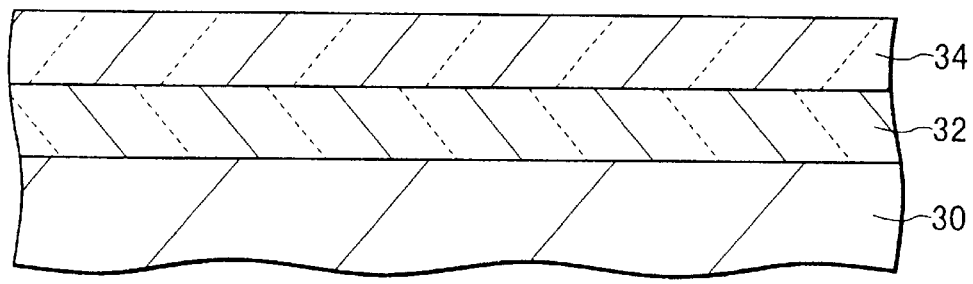
FIG. 1 is a schematic cross sectional view of a substrate and shows the step of fabricating an insulating layer in the process of forming a multi-layered wiring according to an embodiment of the present invention.
Figure 2:
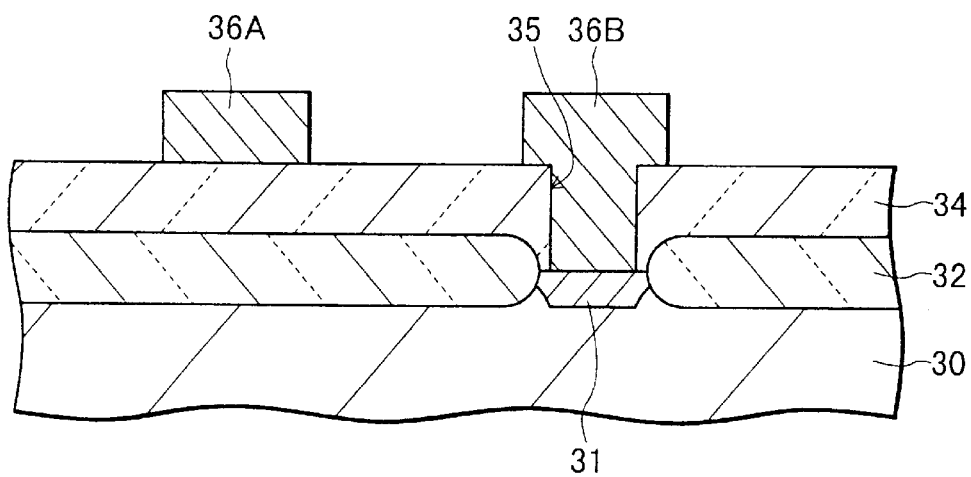
FIG. 2 is a schematic cross sectional view of a substrate and shows the step of fabricating a first level wiring, succeeding the step shown in Fig. 1.
Figure 3:
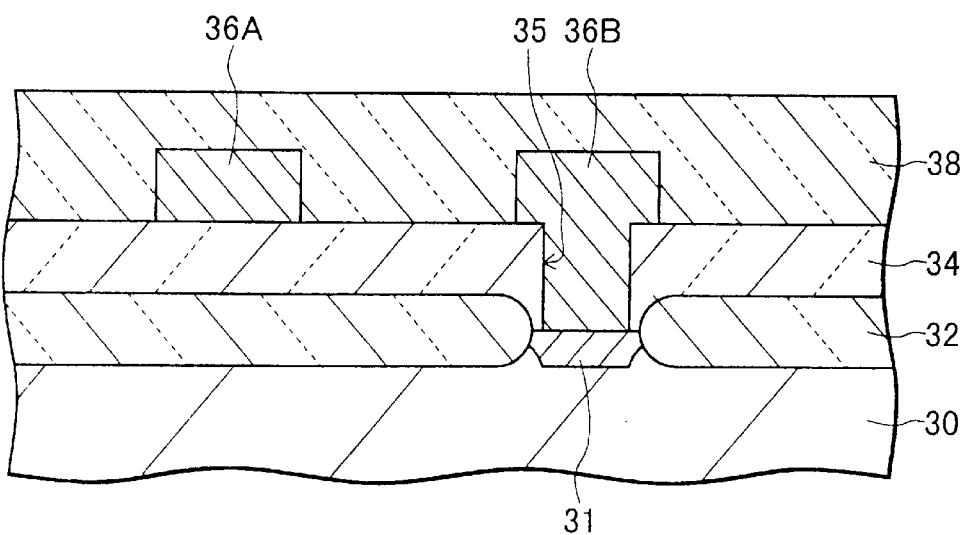
FIG. 3 is a schematic cross sectional view of a substrate and shows the step of fabricating a silicon oxide layer by spin coating, succeeding the steps shown in FIG. 2.
Figure 4:
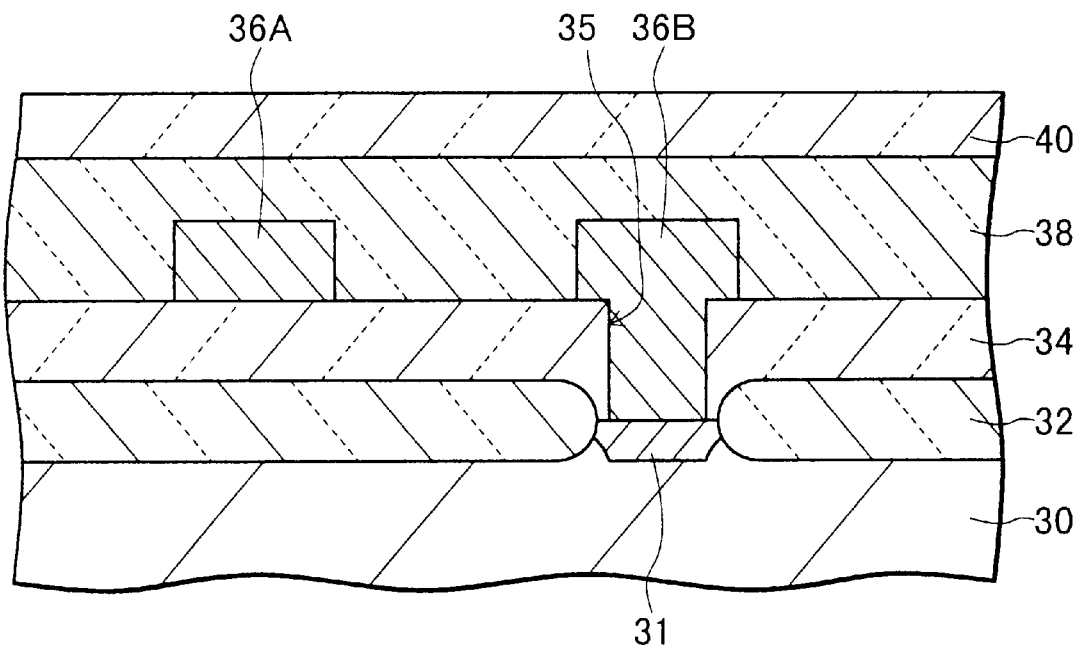
FIG. 4 is a schematic cross sectional view of a substrate and shows the step of fabricating a silicon oxide layer by PECVD, succeeding the step shown in FIG. 3.
Figure 5:
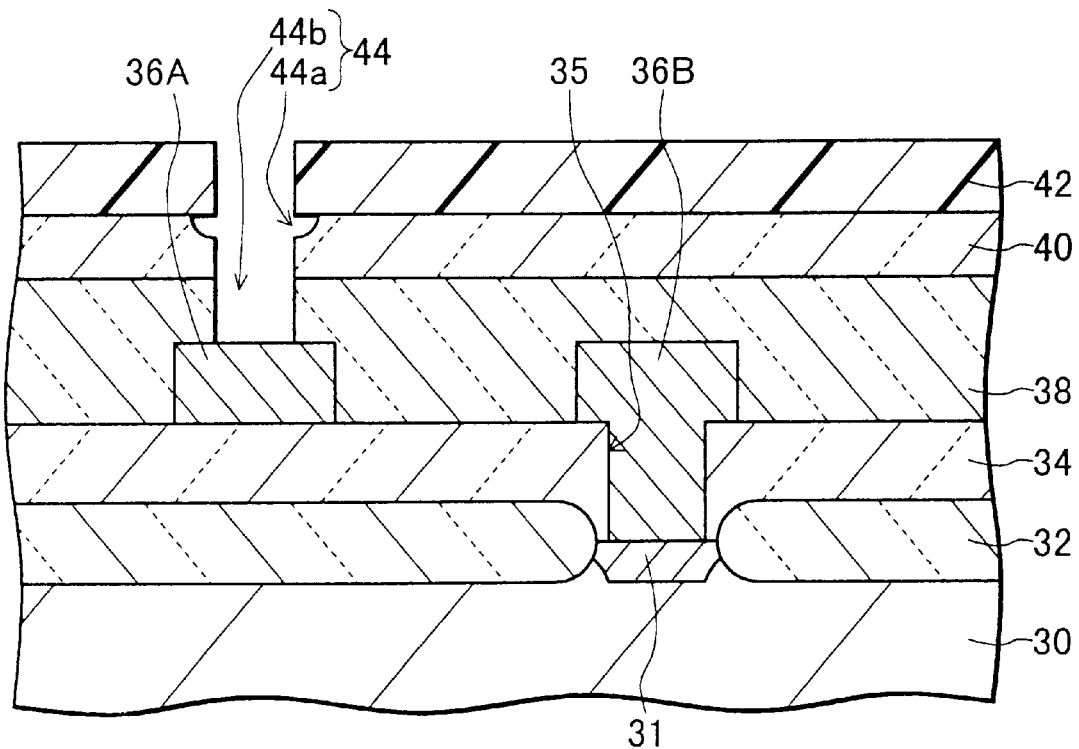
FIG. 5 is a schematic cross sectional view of a substrate and shows the step of fabricating a connecting hole, succeeding the step shown in FIG. 4.

FIGS. 1 to 7 show a method of fabricating a multi-layered wiring according to an embodiment of the present invention. The steps of fabrication (1) to (7) corresponding to FIGS. 1 to 7 are described successively below.

(1) An insulating (field oxide) layer 32 made of silicon oxide or another insulating substance is formed on the surface of a semiconductor substrate 30 made of p-type silicon or another semiconductor. A MOS transistor structure or another device structure is formed on the window or moat portion of the insulating layer 32. An n-type region 31 in the figure is for example, a drain of MOS transistor. After forming a MOS transistor structure, an insulating layer 34 made of BPSG having a thickness of 750 nm is formed on the surface of a substrate by CVD at the normal (1 atm) pressure. The insulating layer 34 is subjected to lamp annealing for densifing the film. The insulating layer 34 was made for example, under the following conditions.

The substrate temperature is 400° C.
The source gases are $SiH_4$ (46.25 sccm)+$PH_3$ (8.75 sccm)+$B_2H_6$ (7.5 sccm)+$N_2$ (50000 sccm)
The lamp annealing is performed for example, under the following conditions.
Temperature of the substrate is 850° C.
Time for temperature rise up to 850° C. is 10 seconds.
The holding time at 850° C. is 10 seconds.

(2) A wiring material layer is deposited on the substrate. The deposited layer is patterned by a selective dry etching. Thus, the wiring layers 36A and 36B are formed. The wiring material layer is for example, made of a lamination of Ti (20 nm), TiON (100 nm), Al alloy (400 nm) and TiN (40 nm) deposited in this order by sputtering. The Al alloy layer was made by sputtering of Al—Si—Cu alloy at a substrate temperature of 150° C. and successive reflowing. In the reflowing, the substrate is heated to about 450° C. without breaking the vacuum to fluidize the Al alloy. By the reflow treatment, a connecting hole 35 is filled up with the Al alloy. The dry etching treatment was done for example, under the following conditions.
The etching gas is $Cl_2$ (30 sccm)+$BCl_3$ (30 sccm)
The pressure in the etching chamber is 10 mTorr.

(3) On the insulating layer 34, a silicon oxide layer 38 is formed flatly, contacting directly with the wiring layers 36A and 36B and covering the wiring layers 36A and 36B. For example, solution of hydrogen silsesquioxane resin dissolved in methyl-isobutyl-ketone (MIBK) is coated directly on the insulating layer 34 and the wiring layers 36A and 36B to a thickness of 500 nm by spin coater. Thereafter the coated film is baked in an $N_2$ atmosphere on a hot plate at 150° C. for one minute, at 200° C. for one minute and at 300° C. for one minute and further annealed at 385° C. for 60 minutes in an atmosphere containing $O_2$ and $N_2$, to form the silicon oxide layer 38.

(4) A silicon oxide layer 40 having a thickness of 500 nm is formed over the silicon oxide layer 38 by PECVD. The silicon oxide layer 40 was formed for example, under the following conditions.
Temperature of the substrate is 400° C.
The source gases are $SiH_4$ (240 sccm)+$N_2O$ (5000 sCCm)+$N_2$ (2800 sccm)
Pressure in the reaction chamber is 2.2 Torr.

(5) A resist layer 42 having a window corresponding to a desired connecting hole is formed by a well-known photolithographic treatment. Thereafter a shallow connecting hole 44a is formed by selective wet etching (isotropic etching) using the resist layer 42 as a mask. The connecting hole 44a has a role to moderate the step of opening edge of a deep connecting hole 44b which is formed later, in order to improve the coverage of the wiring at the step. A mixture of $NH_4F$ solution and HF in a ratio of ten to one was used as etching solution for wet etching.

After the wet etching treatment, a connecting hole 44b extending from the connecting hole 44a to the wiring layer 36A is formed by selective dry etching (anisotropic etching) using the resist layer 42 as a mask. In this case, a condition of dry etching was for example, $CF_4$/$CHF_3$/Ar=5/30/30 sccm. After a dry etching treatment, the resist layer 42 is removed by a well-known ashing or another method. The connecting holes 44a and 44b are hereafter called 44.

(6) A wiring material layer is deposited on the silicon oxide layer 40 covering the connecting hole 44. The deposited layer is patterned by selective dry etching using resist pattern as a mask to form a wiring layer 46 connected to the wiring layer 36A via the connecting hole 44. The wiring material layer was for example, a lamination of Ti (15 nm), Al alloy (1000 nm) and Ti (40 nm) deposited in this order by sputtering. The Al alloy layer was made by sputtering of Al—Si—Cu alloy at a substrate temperature of 150° C. followed by a reflowing treatment to fluidize the Al alloy by heating the substrate at about 450° C. without breaking the vacuum. By the reflowing treatment, the connecting hole 44 is filled up by Al alloy. The dry etching was performed for example, under the following conditions.
The etching gas is $Cl_2$ (30 sccm)+$BCl_3$ (30 sccm)
The pressure in the etching chamber is 10 mTorr.

A lamination comprising silicon oxide layers 38 and 40 has a role of interlayer insulating layer between the wiring layers 36A, 36B and the wiring layer 46.

Figure 6:
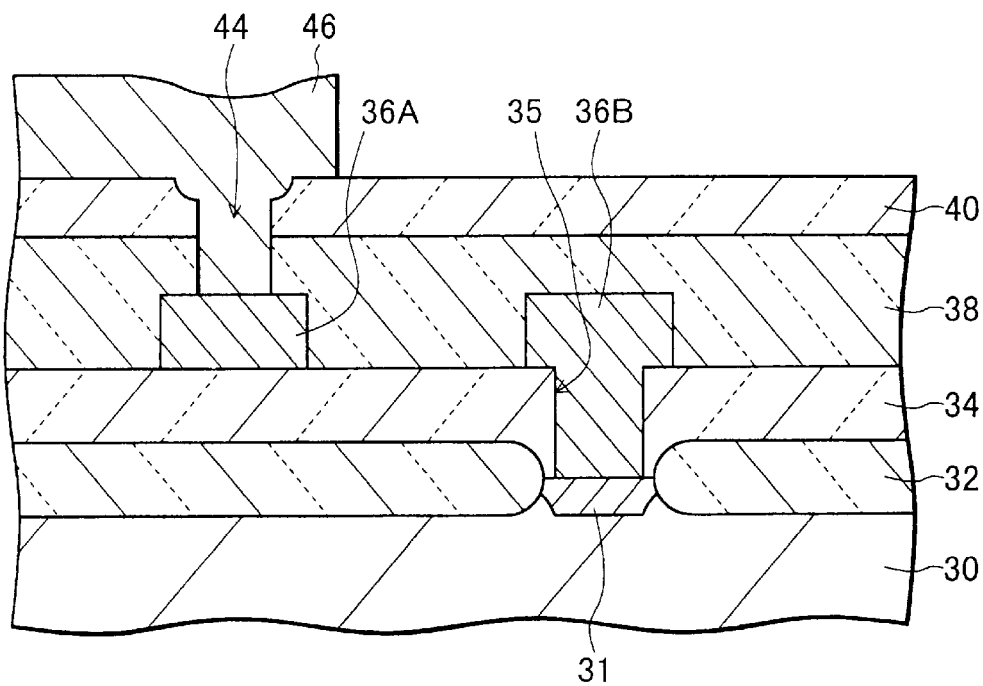
FIG. 6 is a schematic cross sectional view of a substrate and shows the step of fabricating an upper wiring, which is upper than the first level wiring, succeeding the step shown in FIG. 5.
Figure 7:
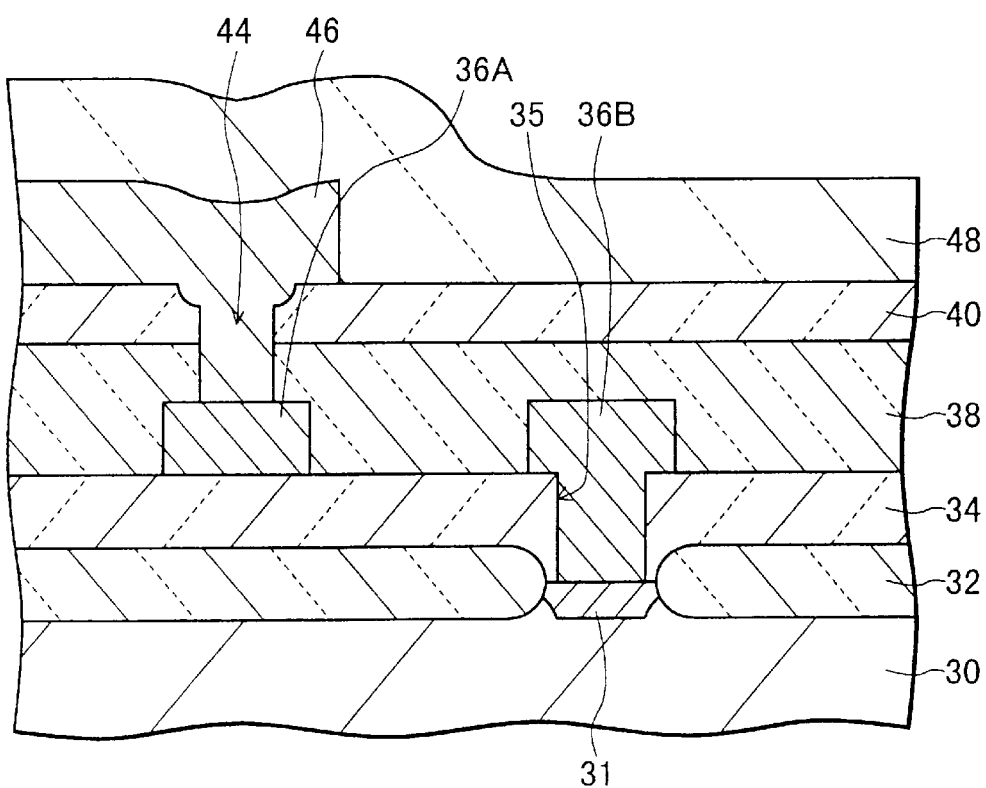
FIG. 7 is a schematic cross sectional view of a substrate and shows the step of fabricating a passivation film, succeeding the step shown in Fig. 6.

(7) In order to reduce the process damages, a hydrogen annealing treatment is given to the wiring structure shown in FIG. 6. The annealing condition was for example, 30 minutes at 400° C. in an atmosphere of $N_2$+$H_2$ (20%). Thereafter, a passivation layer 48 is formed on the silicon oxide layer 40 covering the wiring layer 46. The passivation layer 48 was a a silicon nitride film of 1000 nm in thickness formed by PECVD. The film growth conditions are for example, as follows.
Temperature of the substrate is 400° C.
The source gases are $SiH_4$ (300 sccm)+$NH_3$ (1800 sccm)+$N_2$ (1000 sccm).
The pressure in the reaction chamber is 2.6 Torr.

Figure 8:
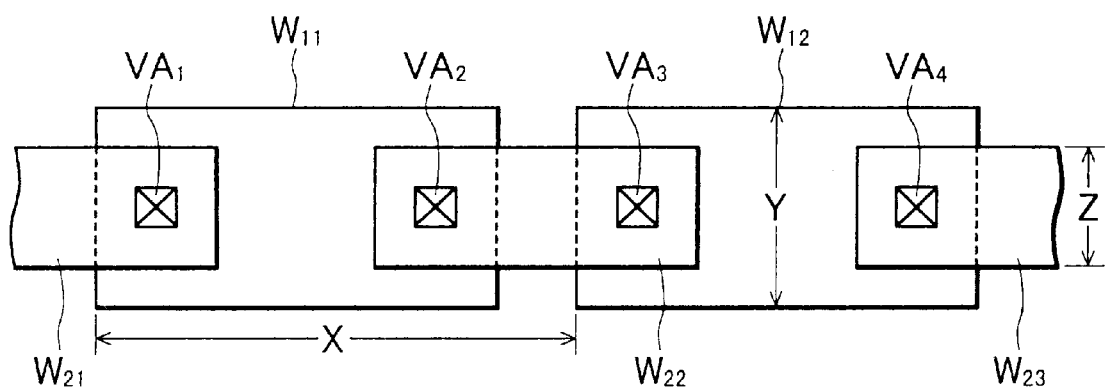
FIG. 8 is a plan view of the wiring structure of a via chain.

In order to make a test of the stress migration for the above-mentioned multi-layered wiring structure, a via chain having 20000 vias, each being similar to the via in a connecting hole 44 was fabricated by a method similar to that mentioned above in connection with FIGS. 1 to 7. FIG. 8 shows a wiring structure of the via chain. Marks $W_{11}$ and $W_{12}$ represent the first level wirings (corresponding to 36A and 36B in FIG. 7), $W_{21}$ to $W_{23}$ represent the upper level wirings (corresponding to 46 in FIG. 7) and $VA_1$ to $VA_4$ represent vias (corresponding to the via 44 in FIG. 7). The vias $VA_1$ to $VA_4$ are connected in series by wiring $W_{21}$, $W_{11}$, $W_{22}$, $W_{12}$ and $W_{23}$. The each via expressed by a square symbol is actually shaped like a colomn. Distance X from one end of the first level wiring $W_{11}$ to one end of the next first level wiring $W_{12}$ is 5 $\mu$m, width Y of each first level wiring is 3 $\mu$m and width Z of each second level wiring is 2 $\mu$m.

Four kinds of via chain A to D shown in Table 1 were fabricated. For each kind of the via chain, 20 pieces of via chain having vias of 0.60 $\mu$m in diameter and 20 pieces of via chain having vias of 0.75 $\mu$m in diameter (total 40 pieces for each kind) were fabricated.

TABLE 1

|  |  | A | B | C | D |
|---|---|---|---|---|---|
| interlayer insulating layer | thickness of the layer 40 (nm) | 500 | 500 | 500 | 500 |
|  | thickness of the layer 38 (nm) | 400 | 500 | 500 | 300 |
|  | thickness of the lower layer (nm) | 300 | 150 | 0 | 150 |
| depth of the connecting hole 44 ($\mu$m) |  | 1.2 | 1.15 | 1.0 | 0.95 |

Figure 10:
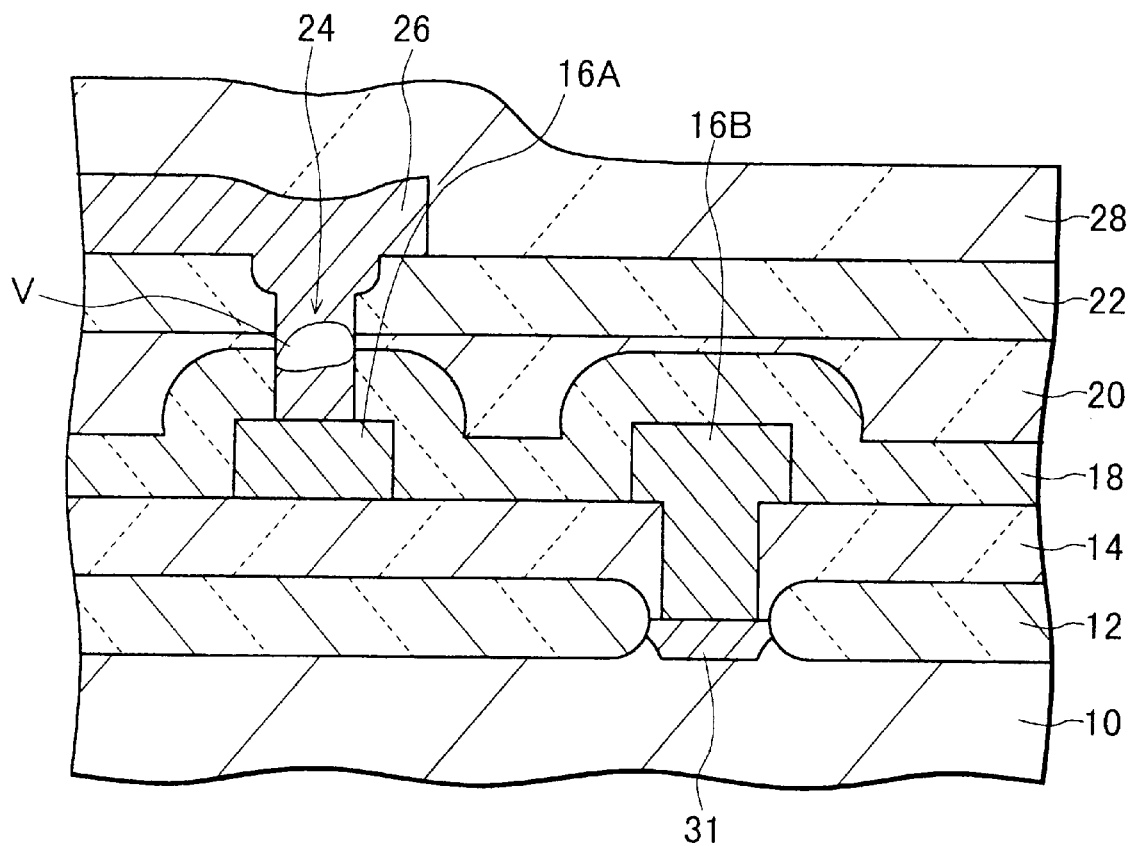
FIG. 10 is a schematic cross sectional view of a substrate and shows a conventionsl multi-layered wiring structure.

Here, "lower layer" denotes the silicon oxide layer (corresponding to 18 in FIG. 10) formed by PECVD, on which the silicon oxide layer (corresponding to 20 in FIG. 10) is formed using hydrogen silsesquioxane resin. The wiring structure of via chains A, B and D with "lower layer" is similar to that shown in FIG. 10 and corresponds to the conventional techniques. On the other hand, via chain C without "lower layer" has a structure, in which a silicon oxide layer (corresponding to 38 in FIG. 7) formed using hydrogen silsesquioxane resin contacts directly with lower layered wiring W11 and W12 and covers them. This is the structure according to an embodiment of the present invention.

In the stress migration test, 40 pieces of the via chain for each kind were held at respective temperatures of 150° C., 200° C. and 250° C. for 2000 hours and the chain resistances were measured before and after the test for every via chain. The via chains exhibited resistance rise more than 10% were decided to be defective. Table 2 shows defect rate due to stress migration for each of the four kinds of via chain A to D and for each via diameter.

TABLE 2

|  |  | A | B | C | D |
|---|---|---|---|---|---|
| via diameter | 0.60 ($\mu$m) | 8/20 | 11/20 | 0/20 | 5/20 |
|  | 0.75 ($\mu$m) | 1/20 | 0/20 | 0/20 | 0/20 |

It can be seen from Table 2 that the resistance change is large for the via with large aspect ratio (small diameter and large depth) and that a defect rate of the via chain C according to the present embodiment is zero for the both via diameters.

Figure 9:
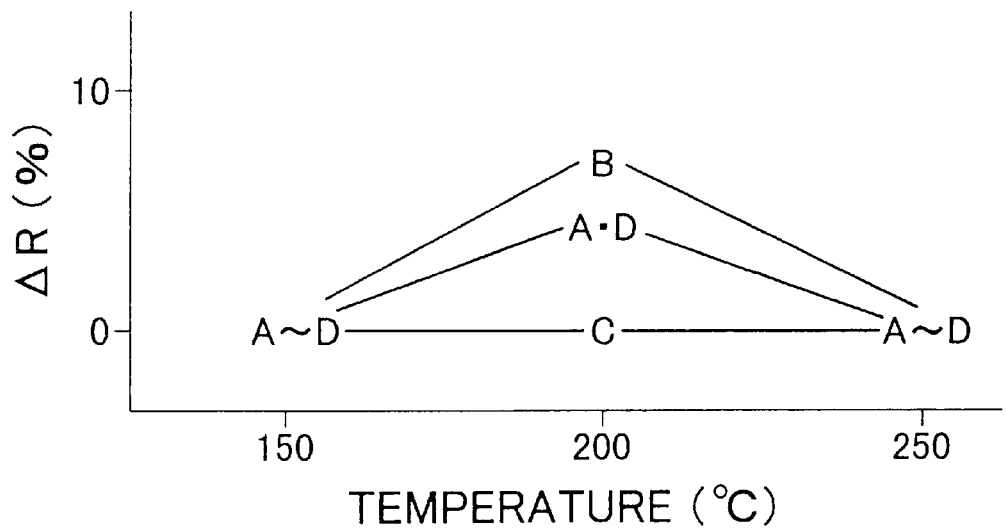
FIG. 9 is a graph showing resistance changes of four kinds of via chains A to D measured for runs at several holding temperatures.

FIG. 9 shows resistance changes $\Delta R(\%)$ in the four kinds of via chain A to D for each holding temperature. Here, the resistance change $\Delta R$ shows a mean value of the resistance changes in 40 pieces of via chain except broken (open-circuited) ones, for every kind of A to D.

FIG. 9 shows that a peak of the resistance change is at the holding temperature of 200° C. The facts that the resistance change is large for the via having large aspect ratio and that a peak of the resistance change is at the holding temperature of 200° C. as shown in FIG. 9 indicate that the resistance change is due to a stress migration by thermal stress between the interlayer insulating layer and the aluminium alloy wiring.

FIG. 9 shows that the resistance rise by stress migration is zero for all the holding temperatures in the via chains according to the embodiment of the present invention.

The present invention is not limited only to the above embodiments. For example, functions of the semiconductor devices are optional. Though an interlayer insulating layer between the first level wiring and the second level wiring has been described as an example, the similar structure can be used for any interlayer insulating layer in a semiconductor device having more than three wiring layers. Various modifications of the embodiments are possible. For example, instead of aluminium alloy, aluminium can be used.

What is claimed is:

1. A method of fabricating a wiring comprising the steps of:

a) providing a substrate;

b) forming a first wiring layer on the substrate;

c) forming a hydrogen silsesquioxane resin film over the first wiring layer to fill spaces created by the first wiring layer and to be directly held in contact with the first wiring layer;

d) subjecting said hydrogen silsesquioxane resin film to a heat treatment so as to provide a first interlayer insulating layer;

e) forming a second interlayer insulating layer on the first interlayer insulating layer;

f) forming a hole through the first and second interlayer insulating layers down to the first wiring layer; and g) forming a second wiring layer over the substrate to be electrically connected to the first wiring layer.

2. A method according to claim 1, wherein the first wiring layer and the second wiring layer are made of a lamination of a Ti layer, a TiON layer, an Al alloy layer and a TiN layer formed in this order from the bottom.

3. A method according to claim 2, wherein the Al alloy layer is reflowed before the TiN layer is formed thereon.

4. A method according to claim 1, wherein the hydrogen silsesquioxane resin is dissolved with methyl-isobutyl-ketone (MIBK).

5. A method according to claim 1, wherein the heat treatment is performed in an inert gas atmosphere.

6. A method according to claim 5, wherein the inert gas atmosphere is a nitrogen gas atmosphere.

* * * * *